United States Patent
Chinthakindi et al.

(10) Patent No.: US 7,902,629 B2
(45) Date of Patent: Mar. 8, 2011

(54) INTEGRATED BEOL THIN FILM RESISTOR

(75) Inventors: Anil K. Chinthakindi, Poughkeepsie, NY (US); Douglas D. Coolbaugh, Essex Junction, VT (US); John M. Cotte, New Fairfield, CT (US); Ebenezer E. Eshun, Essex Junction, VT (US); Zhong-Xiang He, Essex Junction, VT (US); Anthony K. Stamper, Williston, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 12/271,942

(22) Filed: Nov. 17, 2008

(65) Prior Publication Data

US 2009/0065898 A1    Mar. 12, 2009

Related U.S. Application Data

(62) Division of application No. 11/161,832, filed on Aug. 18, 2005, now Pat. No. 7,485,540.

(51) Int. Cl.
| | |
|---|---|
| H01L 29/00 | (2006.01) |
| H01L 27/10 | (2006.01) |
| H01L 29/74 | (2006.01) |
| H01L 23/48 | (2006.01) |
| H01L 23/52 | (2006.01) |
| H01L 29/40 | (2006.01) |

(52) U.S. Cl. ... 257/516; 257/211; 257/758; 257/E21.004

(58) Field of Classification Search ............ 257/211, 257/516, 758, E21.004
See application file for complete search history.

(56) References Cited

U.S. PATENT DOCUMENTS

| | | | | |
|---|---|---|---|---|
| 5,381,046 | A * | 1/1995 | Cederbaum et al. | 257/760 |
| 5,442,235 | A * | 8/1995 | Parrillo et al. | 257/758 |
| 5,455,459 | A * | 10/1995 | Fillion et al. | 257/760 |
| 5,485,138 | A | 1/1996 | Morris | |
| 5,874,770 | A * | 2/1999 | Saia et al. | 257/536 |
| 6,069,398 | A | 5/2000 | Kadosh et al. | |
| 6,287,948 | B1 * | 9/2001 | Ushiyama | 438/606 |
| 6,297,557 | B1 * | 10/2001 | Bothra | 257/767 |
| 6,498,385 | B1 | 12/2002 | Daubenspeck et al. | |
| 6,515,343 | B1 * | 2/2003 | Shroff et al. | 257/530 |
| 6,734,076 | B1 | 5/2004 | Jaiswal et al. | |
| 6,919,617 | B2 * | 7/2005 | Yamada et al. | 257/635 |
| 6,921,962 | B1 * | 7/2005 | Bailey et al. | 257/537 |
| 6,967,350 | B2 * | 11/2005 | Frick et al. | 257/50 |
| 7,189,615 | B2 * | 3/2007 | Rao et al. | 438/250 |
| 7,211,494 | B2 * | 5/2007 | Danzl | 438/382 |
| 7,582,556 | B2 * | 9/2009 | Lin et al. | 438/626 |
| 2001/0049199 | A1 | 12/2001 | Steinmann et al. | |
| 2003/0017699 | A1 | 1/2003 | Zurcher et al. | |
| 2007/0096260 | A1 | 5/2007 | Eshun et al. | |
| 2007/0096319 | A1 | 5/2007 | Hsu et al. | |

* cited by examiner

*Primary Examiner* — Ida M Soward
(74) *Attorney, Agent, or Firm* — Anthony J. Canale

(57) ABSTRACT

In the course of forming a resistor in the back end of an integrated circuit, an intermediate dielectric layer is deposited and a trench etched through it and into a lower dielectric layer by a controllable amount, so that the top of a resistor layer deposited in the trench is close in height to the top of the lower dielectric layer; the trench is filled and the resistor layer outside the trench is removed, after which a second dielectric layer is deposited. Vias passing through the second dielectric layer to contact the resistor then have the same depth as vias contacting metal interconnects in the lower dielectric layer. A tri-layer resistor structure is employed in which the resistive film is sandwiched between two protective layers that block diffusion between the resistor and BEOL ILD layers.

8 Claims, 5 Drawing Sheets

INTEGRATED BEOL THIN FILM RESISTOR

This application is a divisional of U.S. patent application Ser. No. 11/161,832, filed on Aug. 18, 2005 now U.S. Pat. No. 7,485,540.

TECHNICAL FIELD

The field of the invention is that of forming precision thin film resistors during the back end processing of an integrated circuit.

BACKGROUND OF THE INVENTION

Thin film resistors are widely used in the integrated circuit and they are generally fabricated during back end of the line (BEOL) processing. They offer resistances that are better defined than corresponding resistors formed by diffusion into the semiconductor substrate. Additionally, resistors formed in the back end will have less parasitic capacitive coupling to the semiconductor substrate than resistors formed in the front end.

In the past, the integration of the process steps to form precision BEOL resistor was straightforward, as the distance between metal levels in the back end provided sufficient room.

As technology advances and the dimensions of structures shrink, the distance between levels in the back end decreases, while the thickness of the resistor films remains the same, so that the conventional back end resistor takes up a greater fraction of the inter-level spacing. The result is that it becomes increasingly difficult to fabricate precision BEOL thin film resistor between two metal wiring levels.

Accordingly, there remains a need for a novel fabrication technique for forming precision BEOL thin film resistor on the integrated circuit structures.

Additionally, the advancement of semiconductor technology has lead to the introduction of low-k materials such as FSG (fluorinated silica glass) and SiCOH (silicon oxycarbide) films into BEOL processing. The presence of Fluorine and Hydrogen species presents special challenges to the resistor film stability because diffusion of Fluorine and Hydrogen could lead to the poison of resistive films which could result in resistance shift.

In view of the foregoing, there is a need in the art for a novel fabrication method for forming thin film precision BEOL resistor and a technique to protect resistors from interacting with BEOL ILD dielectric material.

SUMMARY OF THE INVENTION

The invention relates to a method of integration of a precision BEOL thin film resistor in which the resistor materials are deposited in a trench recessed into an interlevel dielectric (ILD) through a first intermediate layer of ILD; the trench is filled and a second intermediate layer of ILD is deposited to cover the first intermediate layer of ILD to a required net thickness.

A feature of the invention relates to a method of protecting precision BEOL thin film resistor in which a tri-layer resistor structure is employed such that the resistive film is sandwiched between two protective layers.

DETAILED DESCRIPTION

Figure 1:
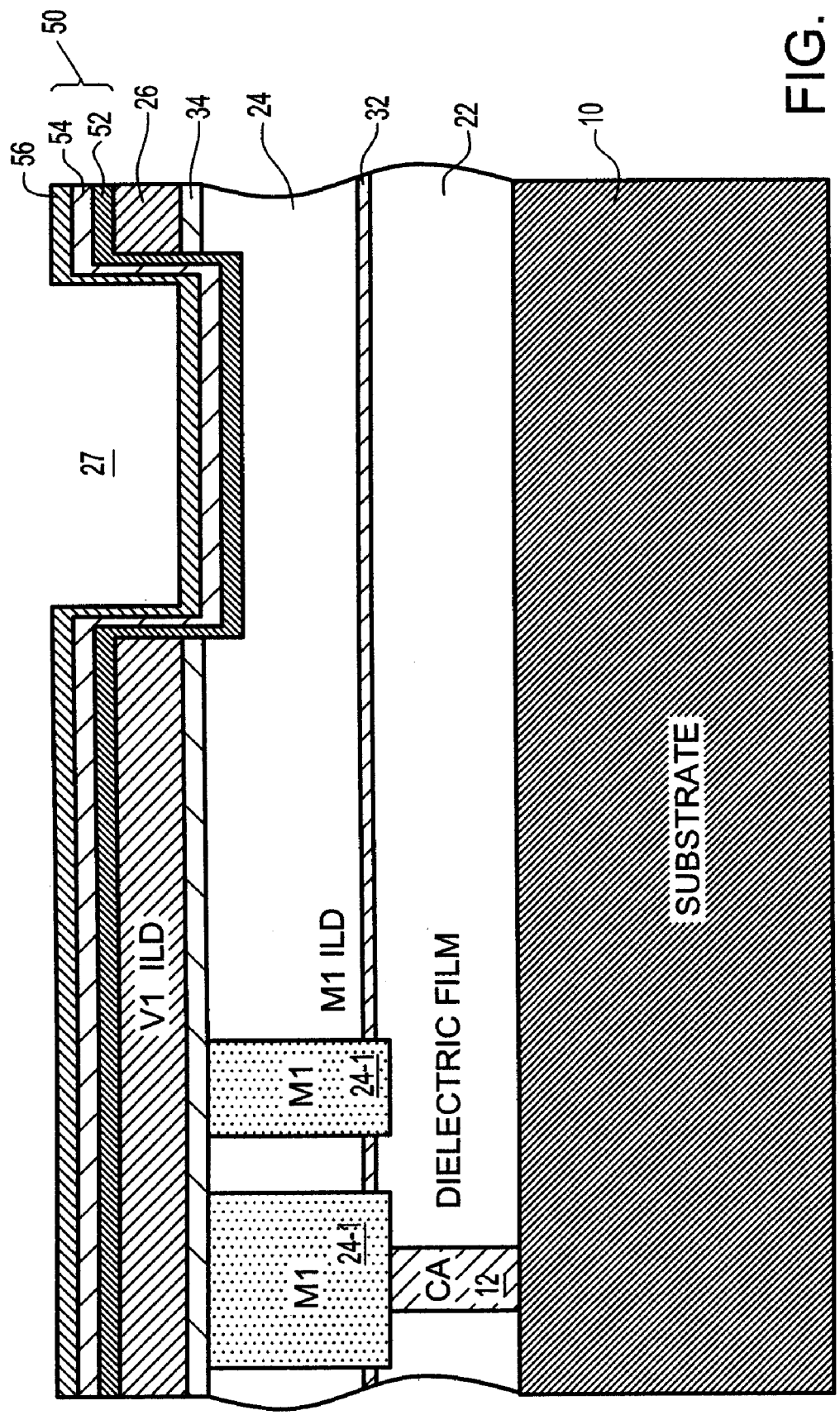
FIG. 1 shows a cross section of an area of an integrated circuit that will hold a resistor after preliminary steps and the deposition of the resistor film.

FIG. 1 illustrates a portion of an integrated circuit that will contain a resistor according to the invention. Substrate 10 is a semiconductor substrate that contains the transistors, and other circuit elements of the integrated circuit in question. Dielectric layer 22 is the lowest dielectric layer, illustratively penetrated by contact 12 representing the first level of interconnect of the circuit. Cap layer 32 is a conventional protective cap, illustratively formed from silicon nitride (Si3N4), SiC or other conventional materials known to the art. Cap layer 32 is optional and will be used when the improved yield justifies the additional expense.

The second level of dielectric 24, referred to as M1 (first level metal) dielectric since dielectric 24 contains damascene metal interconnects that are the first level above the device level, surrounds the first level of back end interconnect. Illustratively, two interconnect members, denoted 24-1, extend perpendicular to the plane of the paper on the left side of the figure. Layer 24 will also be referred to as the resistor inter-level dielectric layer, since it contains the thin film resistor. A second cap layer 34 (SiC or Si3N4) has been deposited over the M1 ILD 24.

In this embodiment of the invention, a first intermediate layer of dielectric 26 (e.g. USG (un-doped silicate oxide), FSG (fluorinated silica glass) or SiCOH (silicon oxycarbide) low-k film) has been deposited to a thickness that is the nominal depth of vias in the second level of interconnect. These vias will extend vertically between the second level of metal interconnect (M2) and the first level of interconnect (M1).

On the right side of the figure, a trench has been etched through layer 26, the cap layer 34 and into layer 24 by an adjustable and controllable depth. A blanket composite layer 50 of resistor material is deposited. The depth of the trench is adjustable for thermal conduction optimization between BEOL thin film resistor and semiconductor substrate. In the present embodiment, it is selected such that the composite layer of resistor material 50 is embedded in the trench with the top of the composite resistor material coplanar with second cap layer 34.

Illustratively, composite layer (tri-layer) 50 is made up of a lower protective layer 52, (e.g. Si3N4 of thickness from 10 to 70 nm), a layer of resistive material 54, (e.g. SiCr or TaN of thickness from 30 to 100 nm), and an upper protective cap layer 56 of (e.g. Si3N4 of thickness from 10 to 70 nm). There is an aperture 27 where the trench has been partially filled by composite layer 50. In some applications, the upper or lower cap levels may be optional. It should be noted, in the present embodiment, that the protective layers 52 and 56 also act as diffusion barriers between BEOL ILD materials and resistive material 54.

Figure 2:
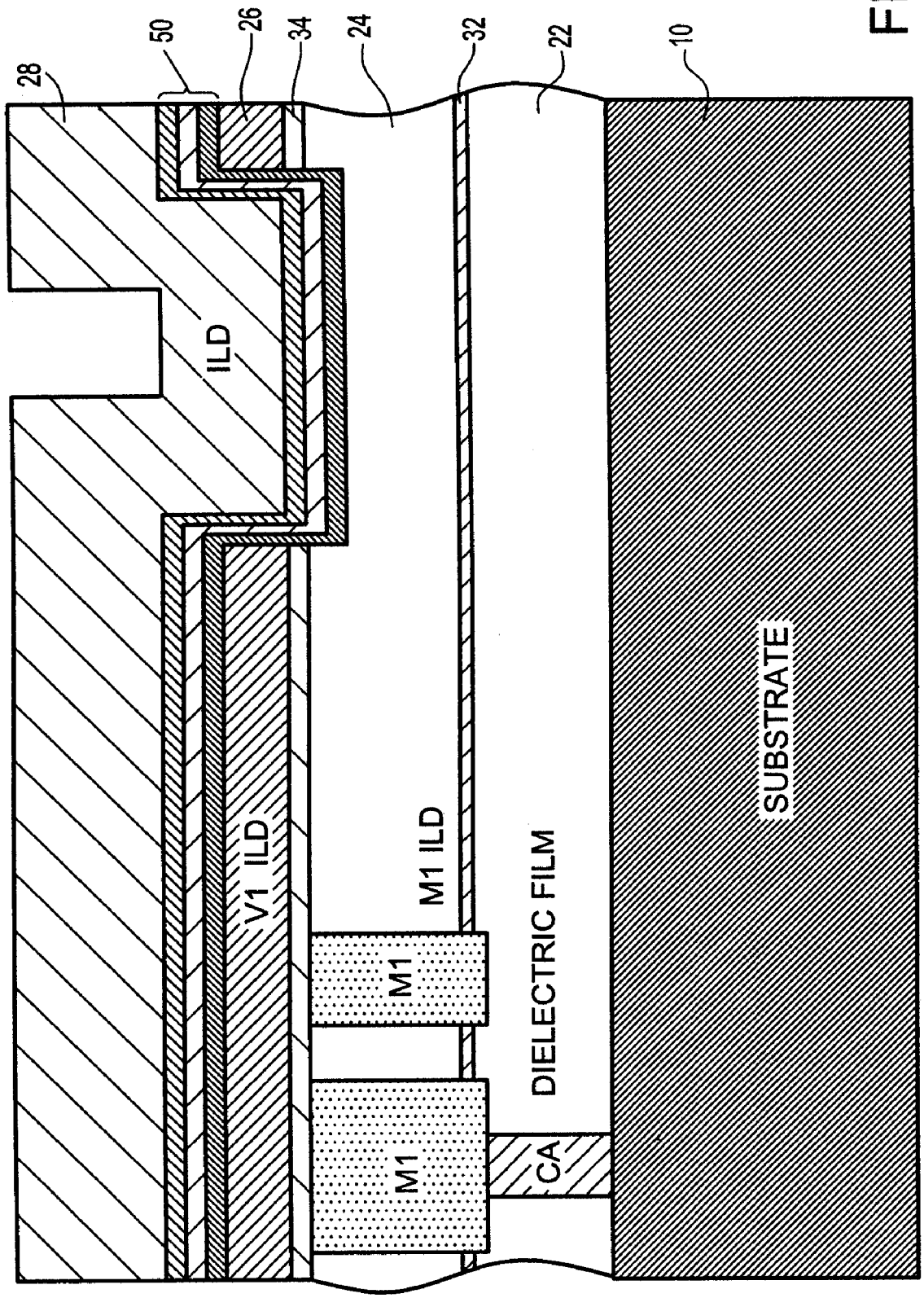
FIG. 2 shows the area after filling in the resistor trench.

FIG. 2 shows the result of depositing a second intermediate sacrificial layer of dielectric 28 over the blanket resistor film. 50 Illustratively, film 28 is the same material as film 26 and is deposited with a thickness such that it fills aperture 27. It should be noted that films 28 and 26 may not be necessarily made of the same material. Additionally over-fill of aperture 27 may be required for planarization optimization.

Figure 3:
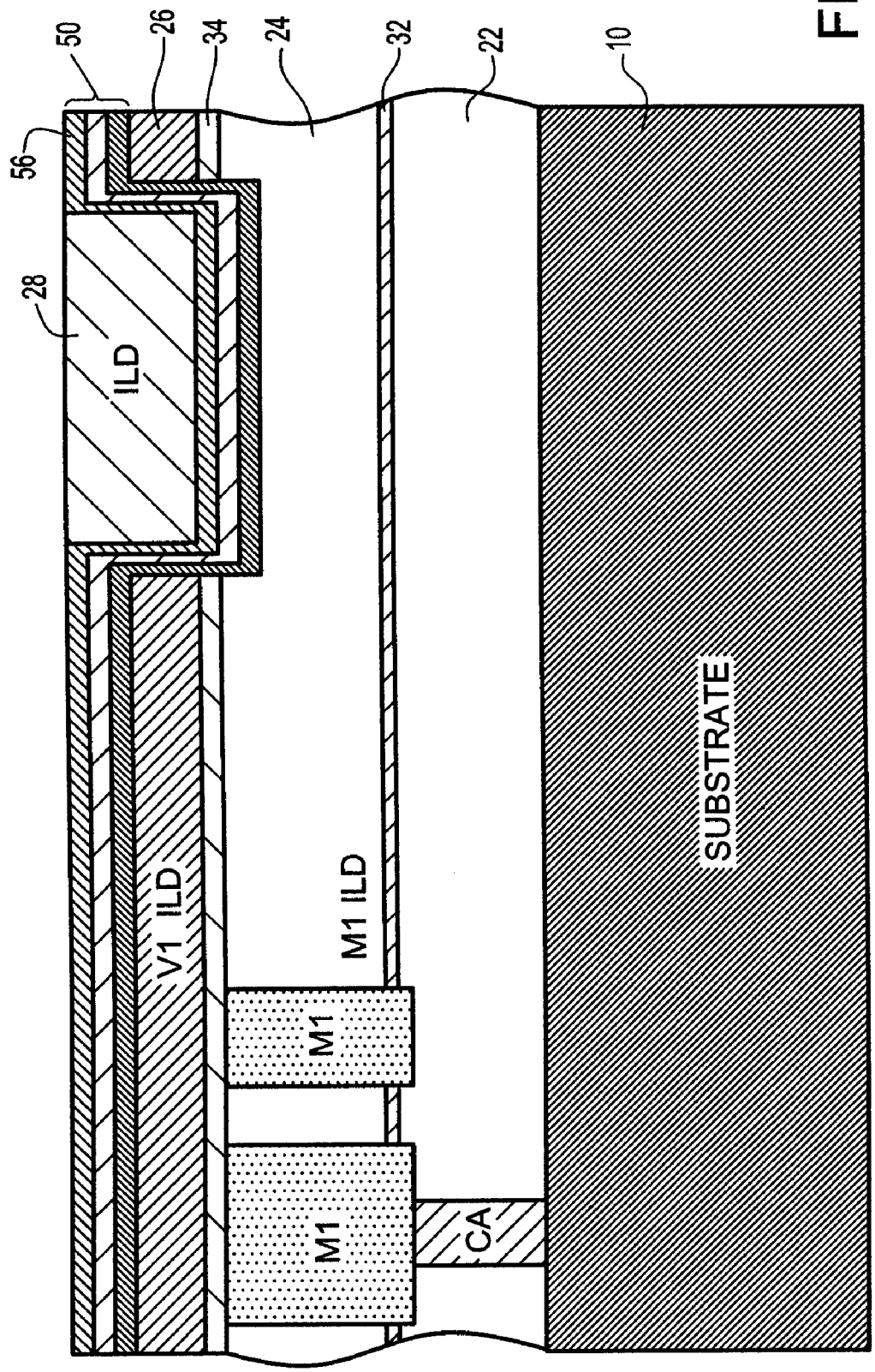
FIG. 3 shows after planarization according to one embodiment.

FIG. 3 shows the result of removing film 28 above resistor film 50, illustratively by chemical mechanical polishing (CMP). The upper protective layer 56 of film 50 should be a good polish stop for CMP polishing of film 28. A portion of film 28 remains in the resistor trench having a top surface coplanar with the top surface of layer 56. Some dishing of film 28 in the region of aperture 27 is expected.

Figure 4:
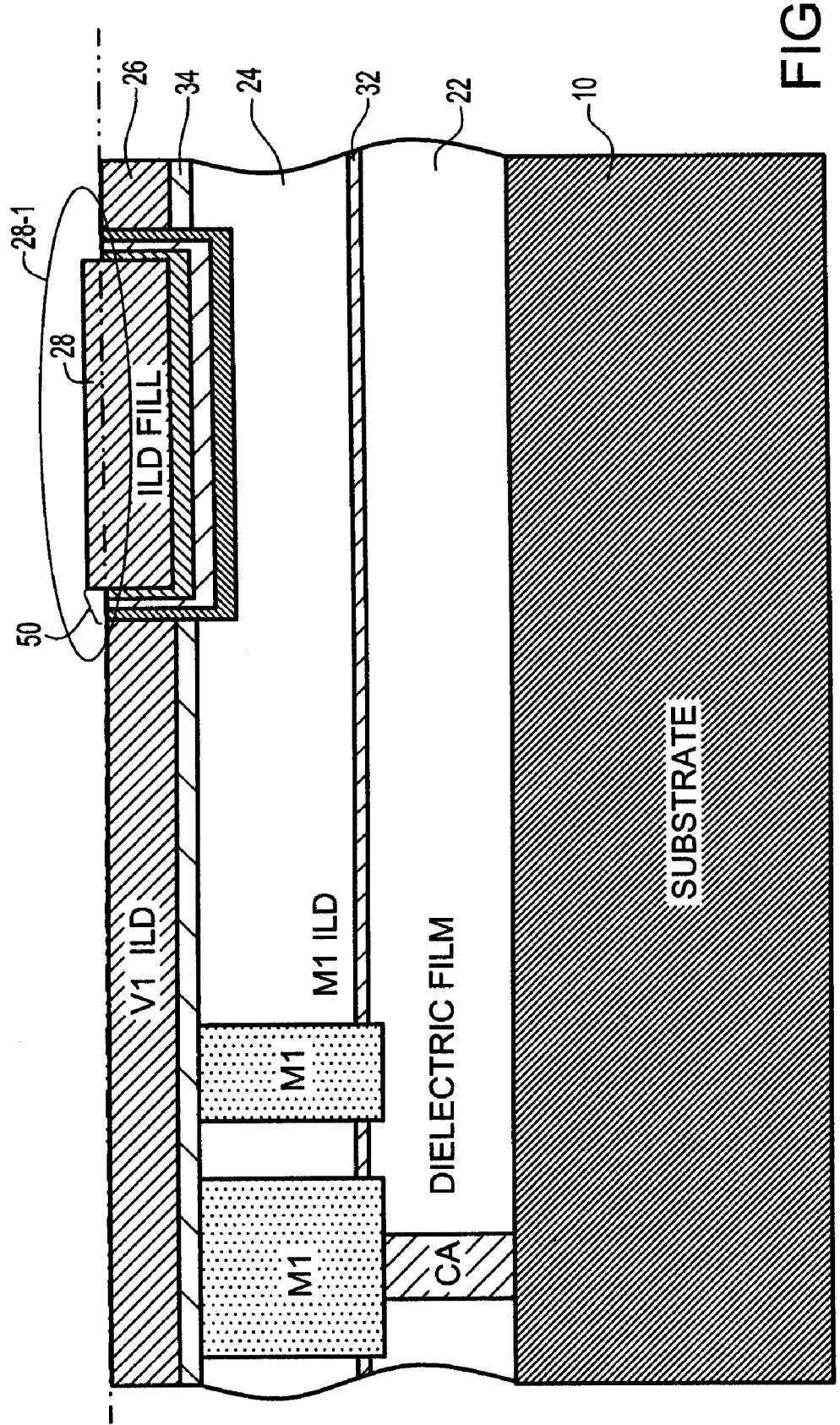
FIG. 4 shows the area after removal of the resistor film.

FIG. 4 shows the result of removing resistor film 50 outside the area of the resistor trench. The removal may be carried out by CMP or etching or a combination of the two methods appropriate for the material used.

An area denoted with an oval 28-1 may be present after this step if the sidewalls of composite film 50 inhibit the removal process locally over the trench. A conventional touch-up CMP may optionally be used to improve the planarity of the top surface of layer 26. The presence of this topography will depend on the materials of film 50 and the technique used to remove the bulk of film 50.

Figure 5:
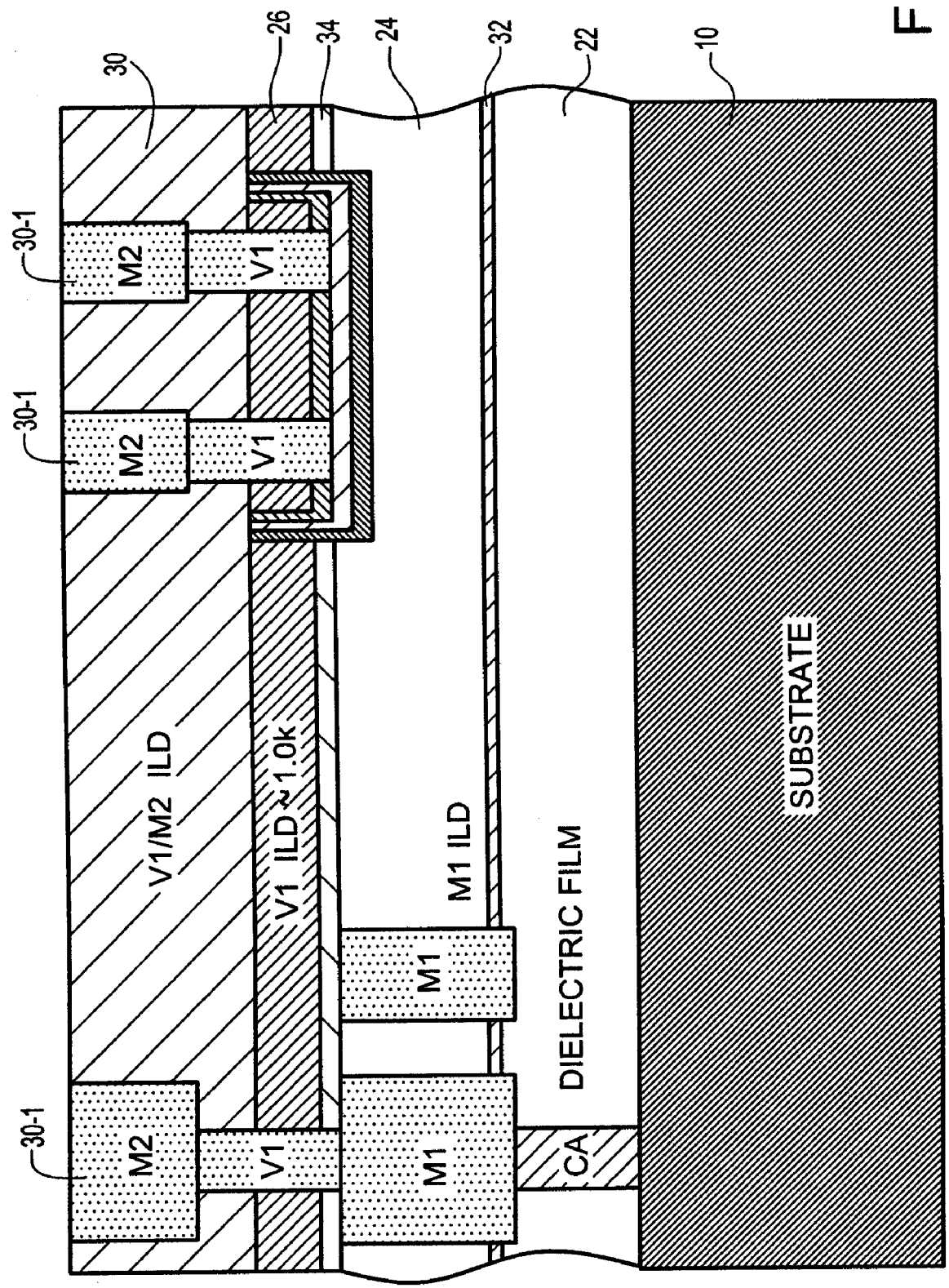
FIG. 5 shows the area after deposition of the next ILD and formation of contacts.

FIG. 5 shows the result of depositing a second intermediate layer of ILD 30 over the area, etching the trenches for the second level of metal interconnect and the second level of vias and filling the vias and trenches with metal. Illustratively, a dual-damascene technique is used. Note that the bottom of the vias are at the same level on the left of the figure where they form a normal connection to M1 as they are on the right side where they contact resistive layer 54. This is an advantage for uniformity in the processing steps, though some variation in the height of the resistive layer can be accommodated in normal manufacturing processing tolerance.

An option is to make the layer 26 thickness such as to avoid interference with the rest of the circuit; i.e. if the thickness of layer 50 is too great to fit within the vertical spacing allowed between metal levels, then the thickness of layer 26 may be set so that the thickness between levels is acceptable with the ground rules being followed.

If convenient, the resistor can be placed above a non-active area such as a shallow trench isolation in order to avoid any interference with the operation of active elements in the device layer of the circuit. However, if heat transfer between the precision BEOL resistor and semiconductor substrate is critical, the BEOL resistor should be placed to the semiconductor substrate as closely as possible.

The depth of penetration of the trench into the lower dielectric layer is not critical. Normal manufacturing tolerance on etching can accommodate some variation in the height of the resistor and the metal interconnects nominally on the same level.

While the invention has been described in terms of a single preferred embodiment, those skilled in the art will recognize that the invention can be practiced in various versions within the spirit and scope of the following claims.

What is claimed is:

1. A resistor formed during a back end of line (BEOL) semiconductor processing for an integrated circuit comprising: a substrate with at least one resistor interlevel dielectric (ILD) layer disposed above at least one lower dielectric layer; a first intermediate layer of dielectric disposed on said resistor interlevel dielectric layer; a resistor formed in a resistor trench extending through said first intermediate layer and extending a controllable depth into said resistor ILD layer, said resistor comprising a composite layer of resistor material in said resistor trench; a trench fill material deposited above said resistor material in said resistor trench; and a second intermediate layer of dielectric deposited over said first intermediate layer of dielectric and said trench fill material.

2. A BEOL resistor according to claim 1, formed within a trench with a trench depth adjustable for optimized heat transfer from said BEOL resistor to a semiconductor substrate.

3. A BEOL resistor according to claim 1 disposed over a non-active semiconductor substrate area for reduced parasitic capacitive coupling to said semiconductor substrate.

4. A BEOL resistor according to claim 1 disposed over an active semiconductor substrate for maximum heat transfer from said BEOL resistor to the semiconductor substrate.

5. A BEOL resistor according to claim 1, wherein said layer of resistor material comprises a composite layer of resistor materials.

6. A BEOL resistor according to claim 5 in which said composite layer comprises a lower protective layer, said layer of resistive material disposed on said lower protective layer and an upper layer of protective material disposed on said layer of resistive material, whereby interaction between the resistive material and BEOL ILD films is prevented.

7. A BEOL resistor according to claim 1, in which said first intermediate layer of dielectric and said trench fill material comprise substantially the same material.

8. A BEOL resistor according to claim 1, in which said first intermediate layer of dielectric and said trench fill material comprise different materials.

* * * * *